US010804631B2

(12) United States Patent
Wig et al.

(10) Patent No.: US 10,804,631 B2
(45) Date of Patent: Oct. 13, 2020

(54) PCIE CARD EDGE CONNECTOR FOR POWER DELIVERY

(71) Applicant: Intel Corporation, Santa Clara, CA (US)

(72) Inventors: Timothy Wig, Northborough, MA (US); Manisha M. Nilange, Portland, OR (US); Thane M. Larson, Portland, OR (US); Horthense Delphine Tamdem, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/436,743

(22) Filed: Jun. 10, 2019

(65) Prior Publication Data

US 2019/0296470 A1 Sep. 26, 2019

Related U.S. Application Data

(60) Provisional application No. 62/778,802, filed on Dec. 12, 2018.

(51) Int. Cl.
H05K 1/00 (2006.01)
H01R 12/73 (2011.01)
H01R 12/70 (2011.01)

(52) U.S. Cl.
CPC ....... H01R 12/737 (2013.01); H01R 12/7023 (2013.01); H01R 12/7076 (2013.01); H01R 12/7094 (2013.01)

(58) Field of Classification Search
USPC ........................................................ 361/748
See application file for complete search history.

(56) References Cited

U.S. PATENT DOCUMENTS 8,942,057 B1 * 1/2015 Xiao .................. G11C 7/20
365/228
9,735,489 B1 8/2017 Fan
(Continued)

FOREIGN PATENT DOCUMENTS

WO 2004019453 A1 3/2004
WO 2018031283 A1 2/2018

OTHER PUBLICATIONS

EPO; Extended European Search Report issued in EP Application No. 19204241.4; dated Jan. 22, 2020; 8 pages.

Primary Examiner — Andargie M Aychillhum
(74) Attorney, Agent, or Firm — Alliance IP, LLC

(57) ABSTRACT

A device includes a circuit board with circuit components, and first edge finger tab extending from the circuit board, and a second edge finger tab extending from the circuit board. The first edge finger tab includes electrical contacts to provide signaling to and from particular circuit components of the circuit board, and is to mate with a Peripheral Component Interconnect Express (PCIe)-compatible edge card connection mechanism of a baseboard. The second edge finger tab includes electrical contacts to provide power delivery to the circuit board, is to mate with a second edge card connection mechanism of the baseboard. In some aspects, the second edge finger tab may be a PCIe-compatible feature that is typically to prevent the device from being inserted into a legacy PCI edge card connection mechanism, or with a PCIe-compatible feature that is typically to engage a retention mechanism of a baseboard.

20 Claims, 11 Drawing Sheets

(56) References Cited

U.S. PATENT DOCUMENTS

| | | | |
|---|---|---|---|
| 2013/0114230 A1* | 5/2013 | Zhou | G06F 1/185 361/803 |
| 2015/0282319 A1 | 10/2015 | Salzman et al. | |

* cited by examiner

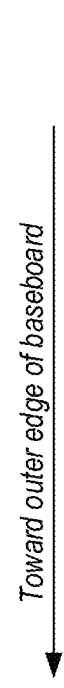
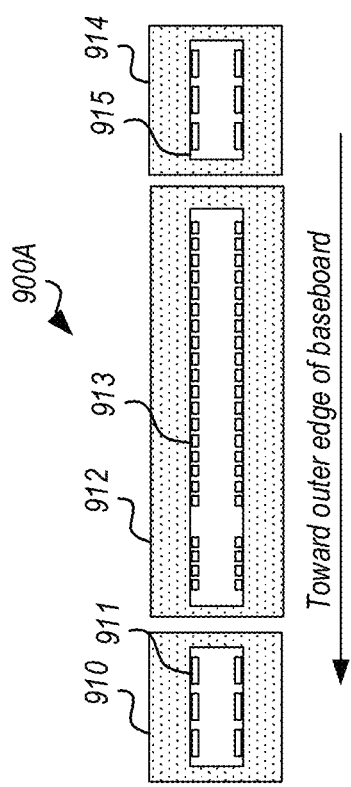
FIG. 9A
FIG. 9B
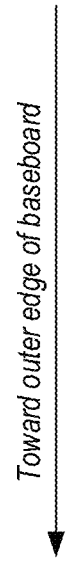
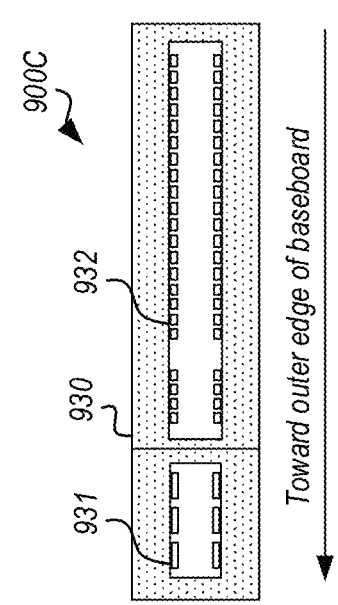
FIG. 9C
FIG. 9D

PCIE CARD EDGE CONNECTOR FOR POWER DELIVERY

CROSS REFERENCE TO RELATED APPLICATIONS

This application claims the benefit of and priority from U.S. Provisional Patent Application No. 62/778,802 entitled "PCIe High Power Card Edge Connector" and filed Dec. 12, 2018, the entire disclosure of which is incorporated herein by reference.

FIELD

This disclosure pertains to computing systems, and in particular (but not exclusively) to card edge connectors for power delivery to add-in card devices, such as PCIe-compatible add-in cards.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

Not only have developments in computing enabled more processing power to be implemented in smaller packages, demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical. In fact, interconnects have grown from more traditional multi-drop buses that primarily handled electrical communications to full blown interconnect architectures that facilitate fast communication. Further, as the demand for future high-performance processors increases, demand grows for interconnect architectures capable of supporting the corresponding high data rates made available by next generation processors.

BRIEF DESCRIPTION OF THE DRAWINGS

FIGS. 9A-9D illustrate embodiments of edge card connectors for communicably coupling add-in cards to a baseboard and for providing additional power delivery to the add-in card through additional connection mechanisms.

DETAILED DESCRIPTION

Figure 1:
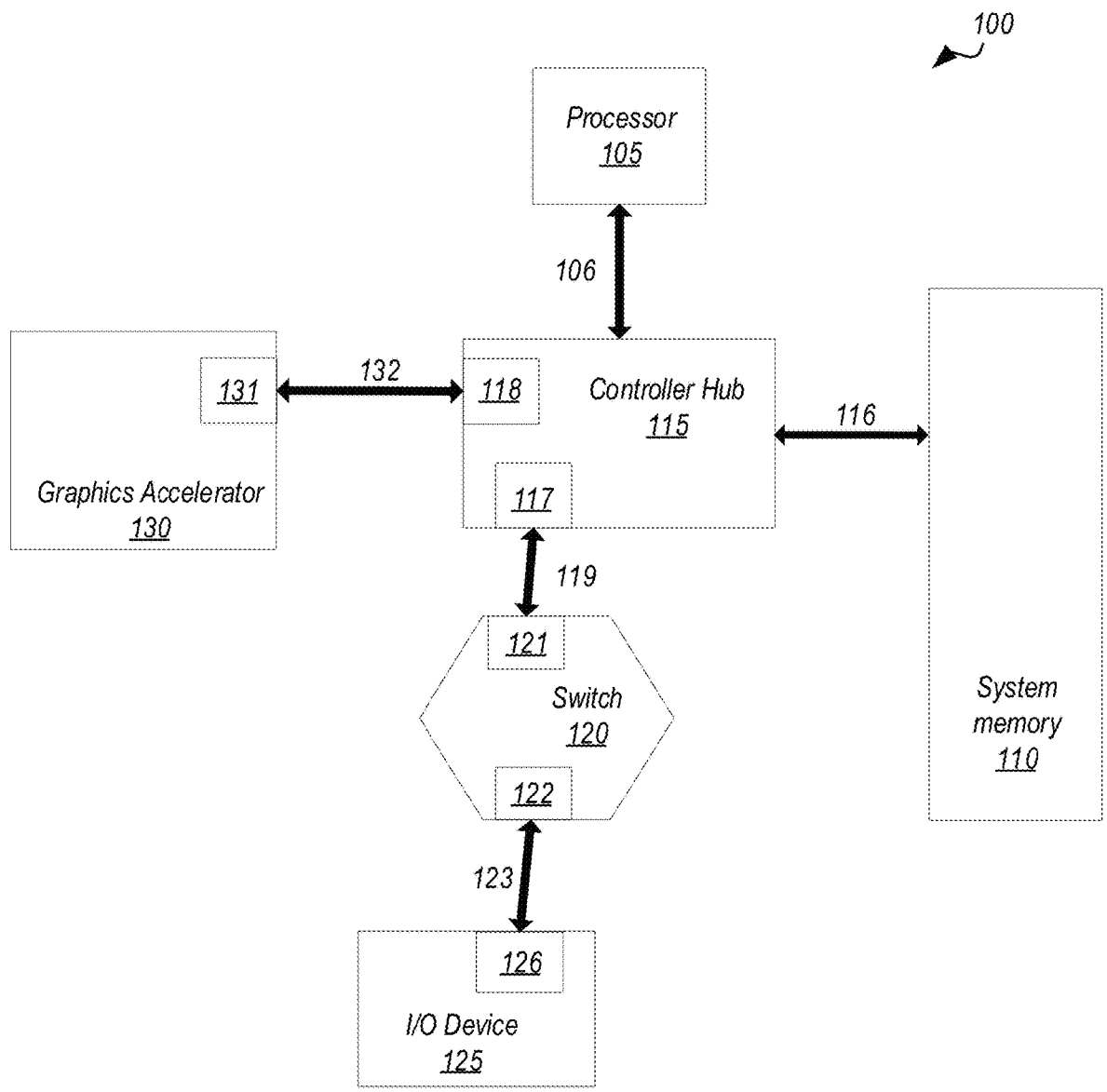
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

Although the following embodiments may be described with reference to enhancements in specific computing systems, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the embodiments described herein.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard, Rack Scale, and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes a processor 105 and system memory 110 coupled to controller hub 115. The processor 105 includes any processing element, such as a microprocessor, a host processor, an embedded processor, a co-processor, or other processor. The processor 105 may be coupled to controller hub 115 through front-side bus (FSB) 106. In one embodiment, FSB 106 may be a serial point-to-point interconnect as described below. In another embodiment, link 106 includes a serial, differential interconnect architecture that is compliant with different interconnect standard. In some implementations, the system may include logic to implement multiple protocol stacks and further logic to negotiation alternate protocols to be run on top of a common physical layer, among other example features.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

Examples of controller hub 115 include a chipset, a platform controller hub (PCH), a memory controller hub (MCH), a northbridge, an interconnect controller hub (ICH) a southbridge, and a root controller/hub. The term chipset may refer, in some cases, to a platform controller hub (PCH), an in other cases, may refer to two physically separate controller hubs, i.e. a memory controller hub (MCH) coupled to an interconnect controller hub (ICH). In some embodiments, controller hub 115 is a root hub, root complex, or root controller in a Peripheral Component Interconnect Express (PCIe or PCIE) interconnection hierarchy. Peer-to-peer routing may optionally be supported through the controller hub 115 as a root complex. In other embodiments, the processor 105 may include root hub, root complex, and/or root controller functionality in a PCIe interconnection hierarchy, while the controller hub 115 is to communicate with I/O devices, in a similar manner as described below.

In the example shown, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120. In the example shown, switch 120 is coupled to device 125 through serial link 123, and input/output modules 122 and 126, which may also be referred to as interfaces/ports 122 and 126, include/implement a layered protocol stack to provide communication between switch 120 and device 125. The switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices.

Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices. Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in, or coupled to, processor 105. Further, one or more links of the system can include one or more extension devices, such as retimers, repeaters, etc.

Figure 2:
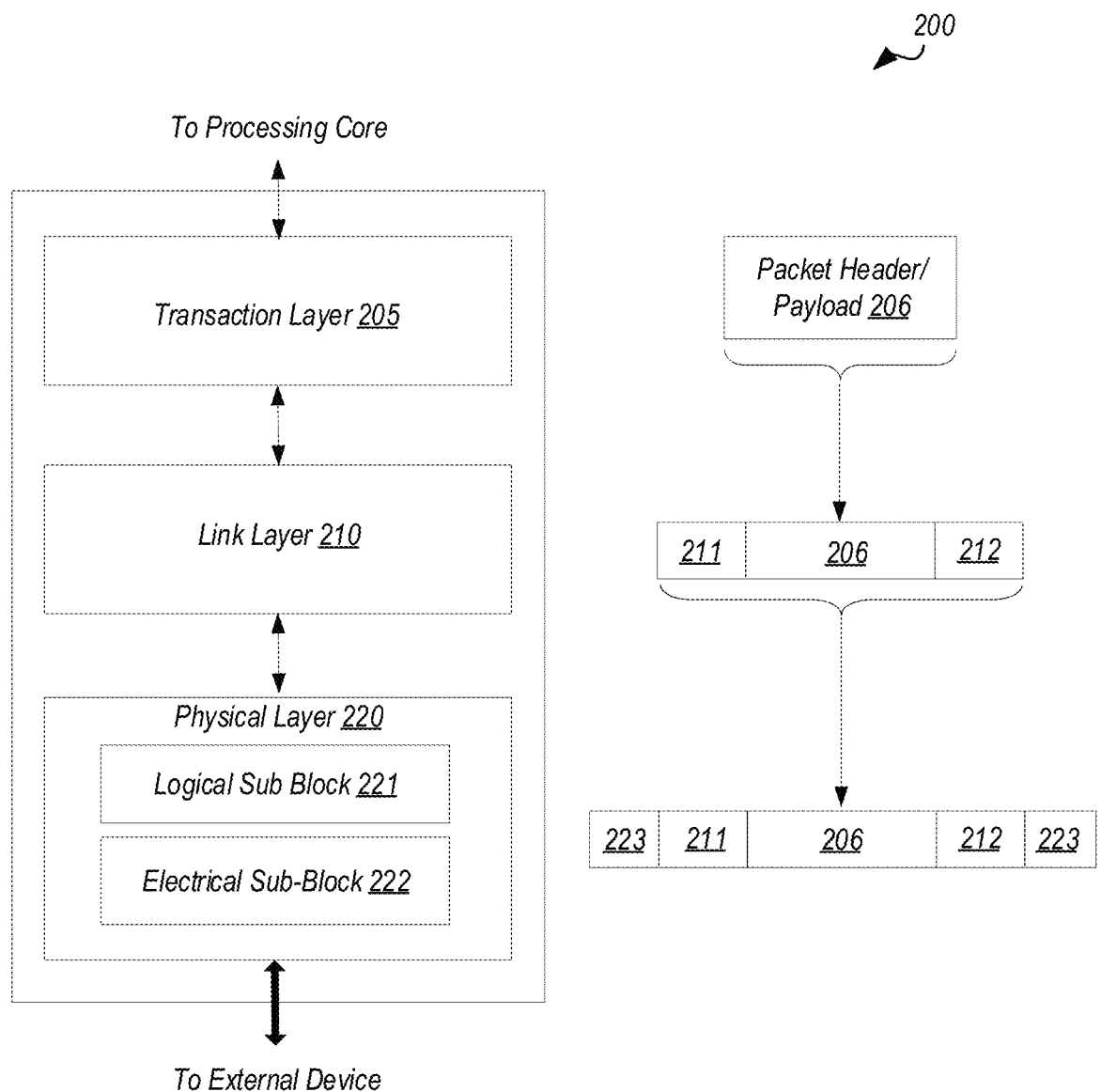
FIG. 2 illustrates an embodiment of a interconnect architecture including a layered stack.

Turning to FIG. 2 an embodiment of a layered protocol stack is illustrated. Layered protocol stack 200 includes any form of a layered communication stack, such as a Quick Path Interconnect (QPI) stack, an Ultra Path Interconnect (UPI) stack, a PCIe stack, a next generation high performance computing interconnect stack, or other layered stack. Although the discussion immediately below in reference to FIGS. 1-4 are in relation to a PCIe stack, the same concepts may be applied to other interconnect stacks. In one embodiment, protocol stack 200 is a PCIe protocol stack including transaction layer 205, link layer 210, and physical layer 220.

An interface, such as interfaces 117, 118, 121, 122, 123, 127, 128, and 131 in FIG. 1, may be represented as communication protocol stack 200. Representation as a communication protocol stack may also be referred to as a module or interface implementing/including a protocol stack.

PCI Express uses packets to communicate information between components. Packets are formed in the Transaction Layer 205 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

Transaction Layer

In one embodiment, transaction layer 205 is to provide an interface between a device's processing core and the interconnect architecture, such as data link layer 210 and physical layer 220. In this regard, a primary responsibility of the transaction layer 205 is the assembly and disassembly of packets (i.e., transaction layer packets, or TLPs). The translation layer 205 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 205. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 205 assembles packet header/payload 206. Format for current packet headers/payloads may be found in the PCIe specification published by the PCI-SIG at the PCIe specification website.

Figure 3:
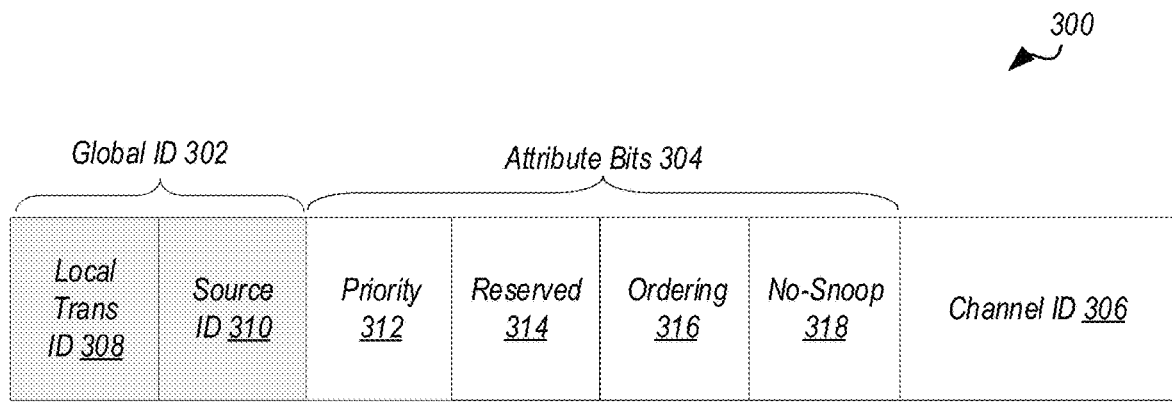
FIG. 3 illustrates an embodiment of a request or packet to be generated or received within an interconnect architecture.

Quickly referring to FIG. 3, an embodiment of a PCIe transaction descriptor is illustrated. In one embodiment, transaction descriptor 300 is a mechanism for carrying transaction information. In this regard, transaction descriptor 300 supports identification of transactions in a system. Other potential uses include tracking modifications of default transaction ordering and association of transaction with channels.

Transaction descriptor 300 includes global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and it is unique for all outstanding requests that require a completion for that requesting agent. Furthermore, in this example, source identifier 310 uniquely identifies the requestor agent within a PCIe hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Link Layer

Link layer 210, also referred to as data link layer 210, acts as an intermediate stage between transaction layer 205 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 220. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is deserialized and supplied to logical sub-block 221. In one embodiment, an 8b/10b transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 4:
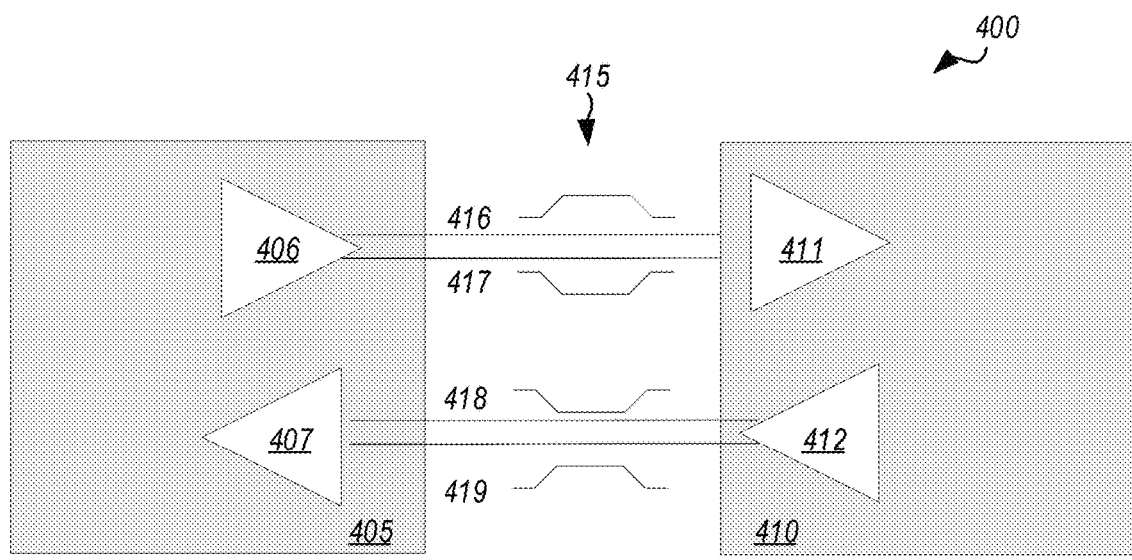
FIG. 4 illustrates an embodiment of a transmitter and receiver pair for an interconnect architecture.

Referring next to FIG. 4, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in a PCIe link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one or more lanes—each lane representing a set of differential signal pairs (one pair for transmission, one pair for reception). To scale bandwidth, a link may aggregate multiple lanes denoted by xN, where N is any supported link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

In some implementations, a high-performance interconnect and corresponding interconnect protocol (e.g., such as a next generation PCIe-based interconnect) may be provided that is capable of operating at high speeds such as 25 GT/s and/or 32 GT/s. In one example, two speeds may be defined for the high performance interconnect, one at 25 GT/s and 32 GT/s, based on the characteristics determined for the channel (e.g., during link training). The interconnect, in one implementation, may be backwards compatible with existing PCIe generations and speeds provided for these generations (e.g., 8 GT/s, 16 GT/s, etc.).

Figure 5:
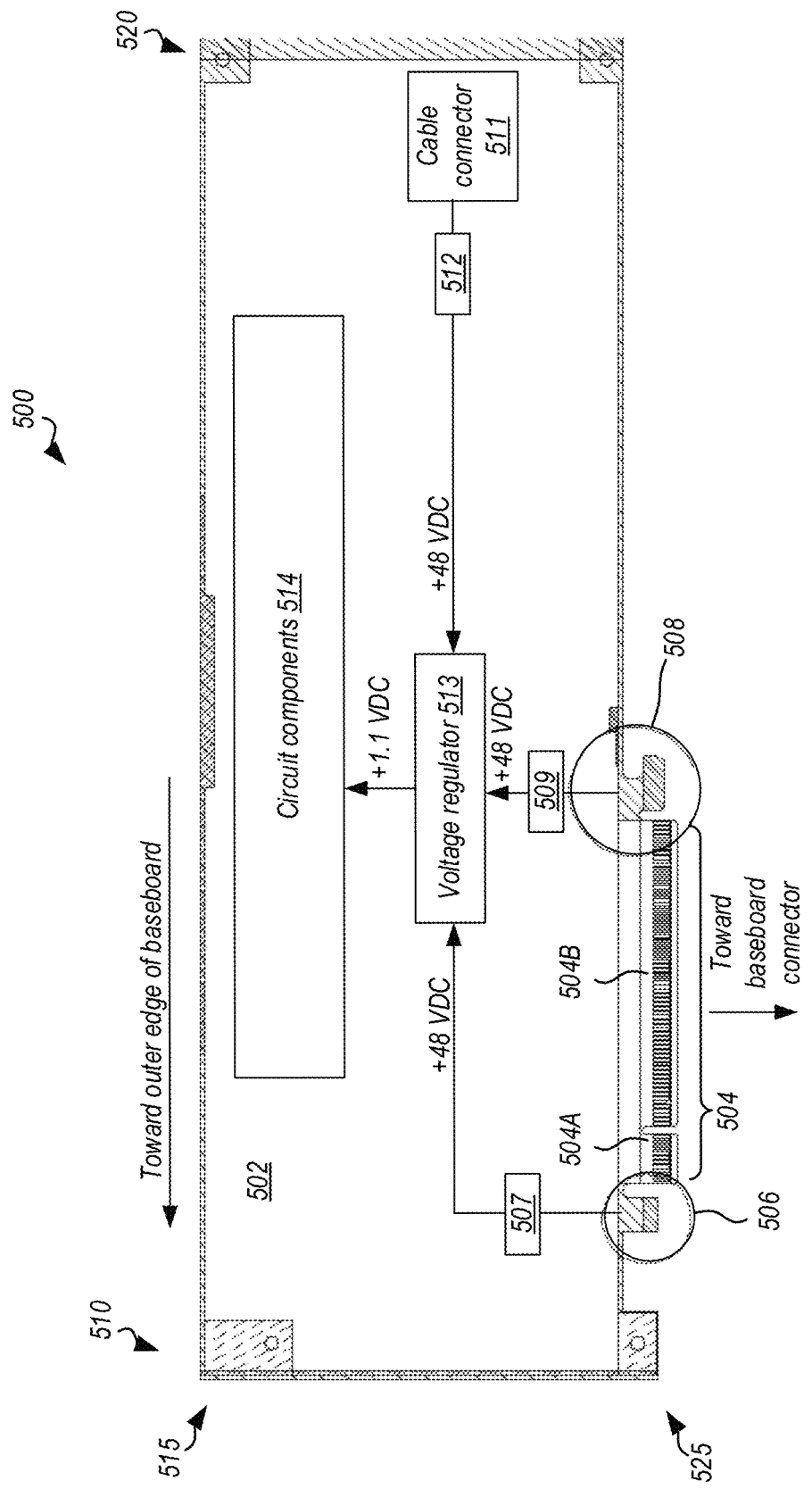
FIG. 5 illustrates an embodiment of a PCIe-compatible add-in card with additional edge finger tabs for providing power delivery to the add-in card.

FIG. 5 illustrates an embodiment of a PCIe-compatible add-in card 500 with additional edge finger tabs 506, 508 for providing power delivery to the add-in card. PCIe-compatible may refer to compatibility with one or more Peripheral Component Interconnect Express specifications published by the PCI-SIG, such as, for example, versions or revisions the PCI Express Base Specification, the PCI Express Card Electromechanical (CEM) Specification, or other specifications published by the PCI-SIG. The example add-in card 500 may be configured to mate with a baseboard (e.g., a motherboard or other type of printed circuit board (PCB)) via an edge connector. The baseboard may include one or more processors and an interconnect architecture for communicably coupling the add-in card 500 and the one or more processors. Once mated with a baseboard, the add-in card 500 may provide certain functionality as described above with respect to FIGS. 1-4. For example, the add-in card 500 may be implemented similar to I/O device 125 of FIG. 1 in an interconnect architecture and may communicate with a processor according to the examples described in FIGS. 2-4. The add-in card 500 may include fewer or additional components or features than those shown in FIG. 5.

In the example shown in FIG. 5, the add-in card 500 includes a circuit board region 502 that includes a number of circuit components (e.g., 514) for implementing the functionality of the add-in card 500. For example, the add-in card 500 may include graphics processing circuitry and the circuit board region 502 may accordingly include one or more GPUs, memory, and other circuit components for implementing such functionality. The add-in card 500 also includes an edge finger tab region 504 that extends from the circuit board region 502 at the bottom end 525 of the card 500 (opposite the top end 515 of the card 500). In the example shown, the edge finger tab region 504 includes two edge finger tabs 504A, 504B. The edge finger tab 504A may be a fixed size for different add-in cards (e.g., based on PCIe specifications), while the edge finger tab 504B may vary in size for different add-in cards (e.g., may be compatible with x1, x4, x8, or x16 PCIe connectors). In the example shown, the edge finger tab region 504 corresponds to an x16 PCIe-compatible edge finger region. In some cases, the two edge fingers tabs 504A, 504B may be considered or referred to as a single edge finger tab (e.g., a PCIe-compatible edge finger tab). The edge finger tab region 504 may be configured to mate with an edge connection mechanism of a baseboard and may include one or more electrical contacts or traces (which may be referred to as "edge fingers") to provide signaling between the circuit components of the circuit board region 502 and components of the baseboard (e.g., a processor). In some cases, the edge finger tab region 504 may also include one or more electrical contacts or traces to provide power delivery from a power supply (e.g., connected to or integrated with the baseboard) to the circuit components. In some implementations, the edge finger tab region 504 may be configured to provide up to 75 W of power to the circuit components in the circuit board region 502.

In some instances, PCIe card and system vendors may desire implementations that involve supplying higher power to a PCIe card at a level beyond the defined capacity of traditional PCIe edge connectors. For instance, while the PCIe Card Electromechanical (CEM) Specification, permits supplemental power delivery to an add-in card by means of a cable (e.g., connected between cable connector 511 and a power supply) to provide a combined slot and cable total of 300 Watts, some applications may actually demand 500-600 Watts, or higher. Further, there is a demand for power delivered on a nominal 48 volt DC rail, which is currently not supported in the 4.0 CEM specification, among other example shortcomings. Traditionally, solutions to exceed 300 Watts may involve proprietary cables from various suppliers. Moreover, any previous or current solutions to supplying power beyond 300 Watts are not compliant with PCIe specifications, so there is no guarantee they will work in a given system. These approaches might require chassis-level agreement between the add-in card vendor and system baseboard vendor to provide the extra power and cooling, among other complexities. In contrast, interoperability between add-in cards that are PCIe specification compliant and system baseboards is generally guaranteed. Further, power delivery by means of cables, such as by supplemental cables connected to cable connector 511 (e.g., an extension to the current 12V auxiliary cable approach), may further obstruct airflow and add cost.

As an alternative to a cabled solution, an add-in card may be implemented with a simple card edge extension to add contacts beyond the current, defined edge finger pinfield. However, as the add-in card outline may be strictly defined by the PCIe spec, the addition of the incremental edge finger tabs beyond the established card perimeter may violate backward compatibility. Further, the downward protrusion of the edge additional finger tab would cause mechanical interference with baseboard components on some legacy system baseboards. Accordingly, an add-in card adapted, for instance, to compute-heavy applications requiring a supply of power at a level that beyond the capacity of the current PCIe card connection mechanisms (e.g., the 75 W that may be provided by the electrical contacts in the edge finger tab region 504), may be implemented while addressing issues related to backward compatibility and mechanical interference. For example, in some embodiments, an add-in card may be provided, which is capable of operating at 500-600 Watts or higher, while delivering power on a nominal 48 volt DC (VDC) rail instead of or in addition to the existing +12 VDC and +3.3 VDC power rails on which power is delivered through the edge finger tab region 504, or on a supplemental 12 VDC rail in addition to the existing +12 VDC and +3.3 VDC power rails.

Accordingly, an example add-in card 500 is illustrated showing the inclusion of additional PCB edge finger tabs 506, 508 that extend from the circuit board region 502 (in-line with the edge finger tab region 504) and are configured (similar to the edge finger tab region 504) to mate with respective edge connection mechanisms of a baseboard. The edge finger tabs 506, 508 may include one or more electrical contacts or traces (which may be referred to as "edge fingers") that provide additional power delivery to the circuit components of the circuit board region 502 beyond the power delivery provided by the edge finger tab region 504. For example, in some embodiments, the electrical contacts on the edge finger tabs 506, 508 may deliver additional power to the add-in card 500 on one or more of a 3.3 VDC rail, a 12 VDC rail, or a 48 VDC rail.

The power delivery provided via the edge finger tabs 506, 508 may be in addition to power delivery via the edge finger region 504 (which may provide, for example, a 3.3 VDC rail and a 12 VDC rail) or power delivery via the cable connector 511 (which may provide, for example, a 48 VDC rail). For instance, in the example shown, the edge finger tabs 506, 508 and the cable connector each provide a 48 VDC rail voltage, which is fed to a voltage regulator 513. The voltage regulator 513 down converts the 48 VDC rail voltages to one or more rail voltages (e.g., 1.1 VDC as shown) that may be suitable for use by the circuit components 514. It will be understood that the voltage regulator 513 may also receive other rail voltages for conversion, such as the 3.3 VDC or 12 VDC rail voltages provided by the edge finger region 504.

In some cases, the edge finger tabs 506, 508 may be connected to a different power supply than the cable connector 511, or each finger tab 506, 508 may be connected to a different power supply. This may cause power to be fed from one power connector through the baseboard to another power connector, which may be undesired. For instance, referring to the example shown in FIG. 5, if power supplies were connected to both cable connector 511 and one or both of edge finger tabs 506, 508, power supplied through cable connector 511 may flow through the board and "back feed" a baseboard power supply. This may cause contention in the voltage regulator 513 or may cause currents in one or more of the connectors to exceed their rated current output, as the connector would see not only the power demand of the add-in card 500 itself, but also the demand of any other devices on the same bus, such as neighboring add-in cards.

Therefore, in some embodiments, current blocking elements (e.g., 507, 509, 512) may be implemented in each of the input paths for the add-in card's power connectors (e.g., 506, 508, 511). The current blocking elements may selectively accept power from only one of the add-in card's power connectors. This would permit the unused power supply connectors to "float", with no power drawn and no direct connection to the other power input connectors. The current blocking elements may be implemented, in some embodiments, as field effect transistors (FETs). In some embodiments (e.g., as shown in FIG. 5), the current blocking elements may be implemented as dedicated power switches connected to the respective power inputs to the add-in card. In other embodiments, the current blocking elements may be integrated into the voltage regulator 513 or other voltage regulators of the circuit board portion.

In the example shown, the edge finger tab 506 is between the edge finger tab region 504 and the end 510 of the card 500 that is configured to face an outer edge of the baseboard (e.g., near a rear panel of a system chassis) when the add-in card is mated with the baseboard, and the edge finger tab 508 is between the edge finger tab region 504 and the end 520 of the card 500 (opposite the end 510) that is configured to face inward (e.g., toward a more central area of a system chassis) relative to the baseboard when the add-in card is mated with the baseboard. In some embodiments, the add-in card 500 may include only one of edge finger tabs 506, 508 rather than both as shown.

In some implementations (e.g., as shown), the edge finger tabs 506, 508 may be formed such that they are compatible with aspects of current PCIe specifications. For instance, in the example shown, some additional power delivery connectors are implemented in the edge finger tab 506, which is a PCIe-compatible feature for preventing the add-in card 500 from being inserted into a legacy PCI edge card connection mechanism (sometimes referred to as a "blocking tab" or with similar nomenclature). Likewise, some additional power delivery connectors are implemented in the edge finger tab 508, which is a PCIe-compatible feature for mating with a retention mechanism of a baseboard (sometimes referred to as a "hockey stick feature" or with similar nomenclature). Accordingly, the example edge finger tab 506 is generally rectangular shaped, and the example edge finger tab 508 is generally hockey stick shaped. In some instances, the outer edges (i.e., those that face toward the baseboard connector) of each of the edge finger tabs 504, 506, 508 may be chamfered similar to the chamfered outer edge 810 shown in FIG. 8 (e.g., with a chamfer angle of 20 degrees, or another suitable chamfer angle) to assist with mating the add-in card 500 to the baseboard.

Aspects of the present disclosure may provide one or more advantages over current power delivery systems for add-in cards. For instance, an edge connector solution according to the present disclosure has the potential advantage of lower cost and/or preserving cooling airflow, as well as largely maintaining backward-compatibility with existing PCIe hardware. In addition, aspects may provide for full backward compatibility with previous revisions of PCI Express specifications (e.g., generations 1.0 through 4.0) by providing power delivery through existing, but otherwise unused features of PCIe card geometry. Unlike the existing power/signal pins in the PCIe CEM connector (e.g., through edge finger tab region 504), the new connectors may be configured specifically for power delivery. As a result, the current carrying capacity of such connectors would likely far exceed the demand of the card. Further, aspects of the present disclosure may meet the immediate need for higher power cards for compute-intensive applications, obviating the need for cabled solutions, which would add cost, block airflow, and introduce mechanical obstructions in the chassis. Some aspects may also make use of relatively unused areas of both the system baseboard and the add-in card, preserving printed circuit board (PCB) routing avenues for both signal and power. Moreover, in some embodiments, the additional power supply traces may be routed near the outer edge of the baseboard, away from the high speed signaling traces used by the existing edge connector. Additionally, the additional edge finger tabs may be tasked with power delivery for a small number of networks (not signal integrity for a large number of signals), which may permit the edge finger tabs to be designed with wide electrical contacts that are relatively insensitive to misalignment. This may make it easier to design the connector for robustness, when mated with a legacy add-in card, for example.

Currently, the PCIe card electromechanical (CEM) specification allows for modest power delivery from a baseboard through the existing edge finger tab region 504, by means of +12 VDC and +3.3 VDC power rails. The maximum combined power provided by the +12V and +3.3Vcard edge connector pins is 75 Watts (75 W), which is delivered through five +12V pins, three +3.3V pins, and a number of ground pins. While the quantity of pins assigned to ground numbers between is 9 and 68 (depending on the card length, x1, x16, etc.), only three ground pins are adjacent to the +12V pins, and those also serve as ground returns for three nearby +3.3V supply pins. Further, since a single metal connector pin geometry is used for power, high speed data, and ground functions, the pins and mating add-in card edge finger tabs are not optimized for power delivery. Recent improvements to the connector contact design have focused entirely on high speed data performance, with no attempt to improve power delivery. As a result, the existing PCIe card edge connector is ill-suited for high power delivery. Delivery of additional power from the baseboard would require an additional power connector.

In backplane applications, system components are on orthogonal PCB panels, similar to the PCIe baseboard and add-in card. In these applications it is common to employ connectors optimized for high speed signaling and separate connectors that are designed for dense power delivery (high current). This multi-connector approach can potentially increase cost, but may save PCB real estate, and maximize performance for both. Backplane connectors typically have two mating components that are mounted separately to the baseboard and backplane, and joined during system assembly. These connectors are generally more costly, and may be adapted for use in high-end systems.

Card-edge connectors serve the same role, connecting a baseboard to an orthogonal PCB panel, but, in contrast, they are provided as single components that are mounted only to the baseboard, accepting mating edge finger contacts manufactured from the mating PCB card edge. In general, the manufacture of card edge connectors is straightforward, with identical connector contacts inserted into a single molded plastic housing component. Some card edge connectors, unlike the PCIe connector, are specifically designed for power delivery. Many of these would be suitable candidates for supplying the needed high current/high voltage delivery. Further, some hybrid card edge connectors even provide separately optimized signal and power delivery contacts in different sections of the same connector body.

An additional PCIe PCB edge finger tab to accommodate edge fingers to engage a power connector would be simple to implement. A corresponding extension to the existing baseboard edge connector to form a new hybrid power/ground PCIe connector would also be straightforward. However, there are shortcomings to this edge connector approach. For instance, there is no suitable solution for implementing a new PCB edge finger tab to deliver the needed power PCIe through a new or modified baseboard connector without violating the PCIe CEM specification. The add-in card outline is strictly defined by the specification, so the addition of the incremental edge finger tabs extending beyond the established card perimeter would violate backward compatibility. The downward protrusion of the edge additional finger tab would cause mechanical interference with baseboard-mounted components on some legacy system baseboards.

Figure 6:
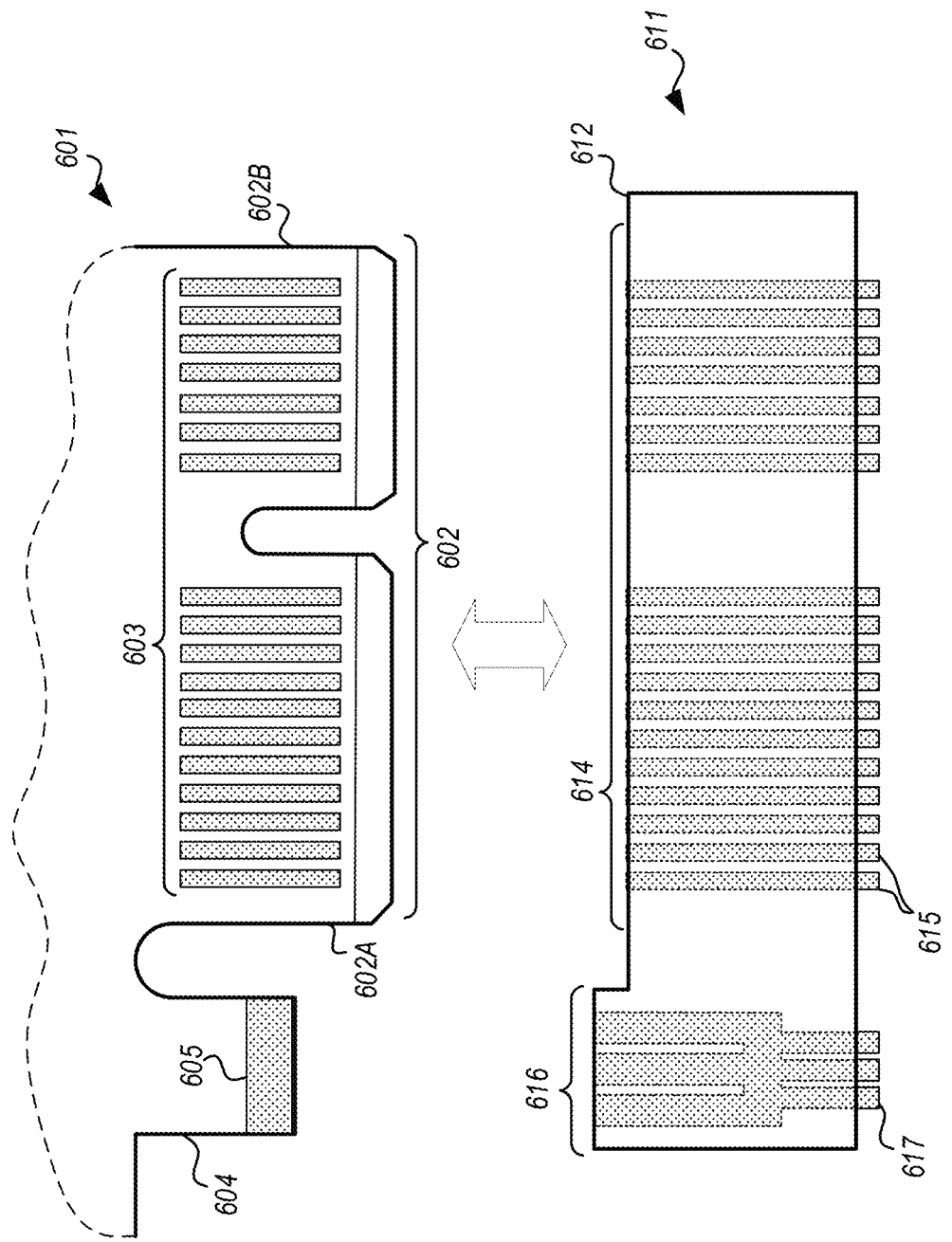
FIG. 6 illustrates an embodiment of coupling between an example add-in card and an example edge card connector.

FIG. 6 illustrates an embodiment of coupling between an example add-in card 601 and an example edge connector 611. The add-in card 601 includes an edge finger tab region 602 with electrical contacts 603. The edge finger tab region 602 includes two separate edge finger tabs 602A, 602B. As shown, the edge finger tab region 602 is configured to be mated with the connection mechanism 614, such that the contacts 603 (or "edge fingers") and contacts 615 are in electrical connection with one another when the card 601 is mated with the edge connector 611. The electrical contacts 603 may provide signaling and/or power delivery to components of the add-in card 601 when coupled to the electrical contacts 615. The add-in card 601 also includes an additional edge finger tab 604 with an electrical contact 605. In some embodiments, the contact 605 may be located at the bottom 3.45 mm of the tab 604, which may be approximately 10 mm wide. Currently, PCIe specifications mandate that this area is to be free of components, surface metal, and solder mask; however, in accordance with the present disclosure, this area may be reassigned as a new edge finger region for a power connector. As shown, the edge finger tab 604 is configured to be mated with the connection mechanism 616, such that the contact 605 and contacts 617 are in electrical connection with one another when the card 601 is mated with the edge connector 611. In the example shown, the edge finger tab region 602 corresponds to a PCIe x1 add-in card. The edge finger tab region 602 may thus be referred to as a PCIe-compatible edge finger region, and the connection mechanism 614 may be referred to as a PCIe-compatible connection mechanism.

The connection mechanism 614 includes electrical contacts 615 that are configured to couple the electrical contacts 603 of the edge finger tab region 602 to traces or components of a baseboard (e.g., to an interconnect architecture such as a PCIe-compatible interconnect architecture as discussed below with respect to FIG. 10). Likewise, the connection mechanism 616 includes electrical contacts 617 that are configured to couple the electrical contact 605 of the edge finger tab 604 to traces or components of a baseboard (e.g., to a power delivery architecture as discussed below with respect to FIG. 10). As shown in FIG. 6, the additional connection mechanism 616 may be at a different height than the PCIe-compatible connection mechanism 614, to account for a height difference between the additional edge finger tab 604 and the PCIe-compatible edge finger tab region 602 of the card 601. In the example shown, the edge connector 611 houses both the electrical contacts 615 and 617. However, in some embodiments, the electrical contacts 615 and 617 may be housed in separate edge connectors.

In the example shown, the edge finger tab 604 is formed in the same manner as a "blocking tab" described in PCIe specification, which prevents the card 601 from being inserted into legacy PCI edge connectors. The edge finger tab 604 may be considered to be generally rectangular shaped. The electrical contact 605 may provide power delivery (in additional to the power delivery provided through one or more of electrical contacts 603) to components of the add-in card 601. In some embodiments, the edge finger tab 604 may include additional contacts to provide signaling to/from the add-in card 601.

The location of the tab 604 may be advantageous since all PCIe-compatible add-in cards are require to have the legacy PCI blocking tab in the same position. In addition, since the location of the tab 604 lies near the rear panel of a chassis in which the card 601 would be placed, the system baseboard may easily implement a 48 VDC power plane/rail in this area. Moreover, this area of the system baseboard is not crucial for high speed signal routing, and the crucial high-speed PCIe bus between a CPU (or other root complex device) and the PCIe connector of the system baseboard would typically not transit the shadow of the blocking tab, so additional baseboard routing layers could more easily be re-tasked as high-power routing without affecting existing PCB routing. Further, since this area is proximate to the rear panel of the chassis, it may facilitate connection to an external 48V power source, with very inconsequential conductive power loss.

Advantages of migrating to 48 VDC rail usage in system chassis need not be confined to providing additional power to high-power (e.g., >300 W) PCIe add-in cards. For example, many system components (including chassis and component fans, disk drives & other storage media, and any lower power devices) may be able to reduce copper loss and its associated chassis heat production with a 48 VDC power rail. In addition, using an external power source may reduce system heating by relocating power conversion (e.g., from 120 VAC to 12 VDC) from inside the chassis to the external 48 VDC source. Because of these considerations, lower power add-in cards, and add-in cards in x1, x4, and x8 lengths could all easily tap into a 48 V bus, and shifting low power add-in cards (e.g., x1 cards) to 48 VDC may also incrementally benefit system cooling. Therefore, in some instances, placing an additional edge finger tab in the location shown in FIG. 6 may be a preferred solution.

The location of the tab 604 may also provide backward compatibility with baseboards that are designed according to older PCIe specifications. For instance, a 48V-compatible add-in card placed into a legacy PCIe Generation 1, 2, 3, or 4 chassis would have its edge finger tab 604 extending from the card over the system baseboard. However, the tab would not be energized, since they would be designed to accept power from the system board connector. In addition, a legacy PCIe Generation 1, 2, 3, or 4 add-in card would have no exposed conductive edge finger on the blocking tab, and only the electrically non-conductive bare FR4 fiberglass board material would engage a 48 V power connector on the system baseboard. In embodiments where the blocking tab has no chamfer on its leading edge, greater insertion force for the add-in card may be needed, but the connector would be designed to accept this tab without suffering damage.

Figure 7:
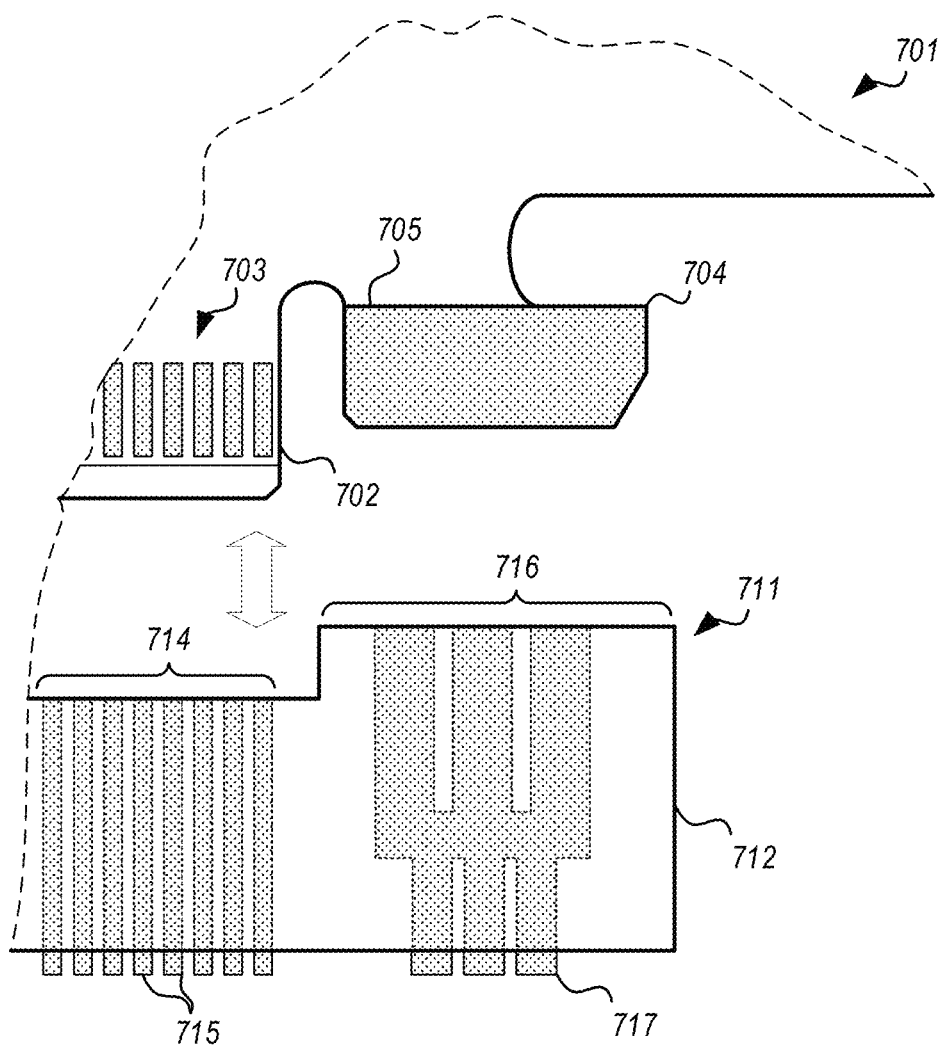
FIG. 7 illustrates another embodiment of coupling between an example add-in card and an example edge card connector.

FIG. 7 illustrates another embodiment of coupling between an example add-in card 701 and an example edge connector 711. The add-in card 701 includes an edge finger tab 702 with electrical contacts 703 ("edge fingers"). As shown, the edge finger tab 702 is configured to be mated with the connection mechanism 714, such that the contacts 703 and contacts 715 are in electrical connection with one another when the card 701 is mated with the edge connector 711. The electrical contacts 703 may provide signaling and/or power delivery to components of the add-in card 701 when coupled to the electrical contacts 715. The add-in card 701 also includes an additional edge finger tab 704 with an electrical contact 705. In some embodiments, the contact 705 may be located on the bottom 5 mm of the hockey stick shaped tab 704, which may be approximately 12.7 mm wide (though, in some cases, the area useable for an edge finger electrical contact may be narrower, e.g., approximately 10 mm). Currently, PCIe specifications mandate that this area is to be free of components, surface metal, and solder mask; however, in accordance with the present disclosure, this area may be reassigned as a new edge finger region for a power connector. As shown, the edge finger tab 704 is configured to be mated with the connection mechanism 716, such that the contact 705 and contacts 717 are in electrical connection with one another when the card 701 is mated with the edge connector 711.

In the example shown, the edge finger tab 702 is part of a PCIe x16 add-in card 701. The edge finger tab 702 may thus be referred to as a PCIe-compatible edge finger tab, and the connection mechanism 714 may be referred to as a PCIe-compatible connection mechanism. The connection mechanism 714 includes electrical contacts 715 that are configured to couple the electrical contacts 703 of the edge finger tab 702 to traces or components of a baseboard (e.g., to an interconnect architecture such as a PCIe-compatible interconnect architecture as discussed below with respect to FIG. 10). Likewise, the connection mechanism 716 includes electrical contacts 717 that are configured to couple the electrical contact 705 of the edge finger tab 704 to traces or components of a baseboard (e.g., to a power delivery architecture as discussed below with respect to FIG. 10). As shown in FIG. 7, the additional connection mechanism 716 may be at a different height than the PCIe-compatible connection mechanism 714, to account for a height difference between the additional edge finger tab 704 and the PCIe-compatible edge finger tab 702 of the card 701. In the example shown, the edge connector 711 houses both the electrical contacts 715 and 717. However, in some embodiments, the electrical contacts 715 and 717 may be housed in separate edge connectors.

In the example shown, the edge finger tab 704 is formed in the same manner as a "hockey stick feature" described in PCIe specifications, which is typically configured to engage a retention mechanism of a baseboard. The edge finger tab 704 may be considered to be generally hockey stick shaped. The electrical contact 705 may provide power delivery (in additional to the power delivery provided through one or more of electrical contacts 703) to components of the add-in card 701. In some embodiments, the edge finger tab 704 may include additional contacts to provide signaling to/from the add-in card 701.

The location of the tab 704 may have similar advantages to those described above with respect to the blocking tab location (e.g., the location of the tab 604 in FIG. 6). Since the vast majority of high-power add-in card devices (e.g., >300 W) implement a x16 card edge interface, the "hockey stick" location (e.g., the location of tab 704 in FIG. 7) would be proximate to the end of the PCIe edge finger region. The location of the tab 704 may also provide backward compatibility as well. For instance, a legacy system board (PCIe Generation 1.0, 2.0, or 3.0, for example) mounting a x16 connector would necessarily have a keep-out in the area of the hockey stick shaped tab 704. The tab 704 and its exposed metal edge fingers would, in most cases, not engage a mating baseboard retention mechanism, since they are already very uncommon, and any retention mechanism, if present, would likely be made of a non-conductive material (e.g., an extension of the plastic PCIe connector body). In the unlikely event that a system baseboard has a metal hockey stick retention mechanism, the exposed terminals would not be energized, and would be shorted at worst. In addition, if a legacy add-in card (PCIe Generation 1.0, 2.0, or 3.0, for example) mounting a x16 connector has a hockey stick retention feature (which is uncommon), it would not have exposed metal edge fingers. As with the corresponding blocking tab solution (e.g., that shown in FIG. 6), the hockey stick would engage the baseboard power connector with only bare PCB material, such as FR4, introducing no electrical risk to either component. Here too, the connector would be designed robustly, with the ability to accept the square-edged, non-chamfered leading edge of the hockey stick.

While the discussions above with respect to FIGS. 5-7 suggest that the power source is a 48 VDC power originating from outside of the chassis, a new power delivery path could be any voltage, or combination of voltages, including supplemental 12 VDC power. In addition, the 48 VDC power source, or supplemental 12 VDC power source, may originate from within the chassis (e.g., from a power supply mounted in the chassis).

Figure 8:
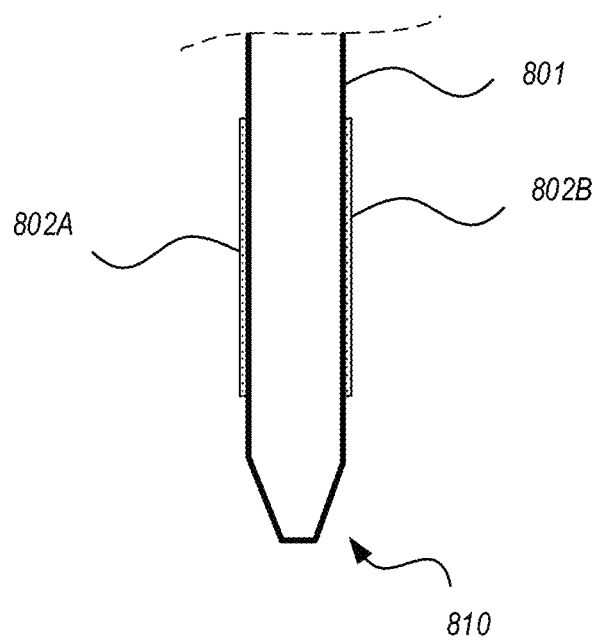
FIG. 8 illustrates an embodiment of an example add-in card edge finger tab with a chamfered outer edge.

FIG. 8 illustrates an embodiment of an example add-in card edge finger tab 801 with a chamfered outer edge 810. The chamfered edge 810 may have a chamfer angle of 20 degrees in some embodiments, or may have another suitable chamfer angle. The chamfered edge 810 may be implemented on any of the edge finger tabs of an add-in card described above. For example, any one of the edge finger tabs 504, 506, or 508 of the add-in card 500 of FIG. 5 may implement a chamfered edge similar to chamfered edge 810. The edge finger tab 801 includes electrical contacts 802A, 802B on either side (which may be referred to as "edge fingers"), which may be implemented similar to the electrical contacts on the edge finger tabs described above.

FIGS. 9A-9D illustrate embodiments of edge card connectors 900 for communicably coupling add-in cards to a baseboard and for providing additional power delivery to the add-in card through additional connection mechanisms. In particular, FIGS. 9A-9D illustrate top views of the example edge card connectors 900. Each of the example edge card connectors 900 includes a connection mechanism (e.g., 913, 922, 932, 941) with electrical contacts that provide signaling and power delivery according to a PCIe-based specification or protocol. Thus, the connection mechanisms 913, 922, 932, 941 may be considered PCIe-compatible. For example, the connection mechanisms 913, 922, 932, 941 may mate to a PCIe-compatible edge finger tab region of a PCIe-compatible add-in card (e.g., add-in card 500 of FIG. 5). The connection mechanisms 913, 922, 932, 941 may be an x1, x4, x8, or x16 PCIe connection mechanism. In each of the examples shown, the additional connection mechanisms are in-line with the PCIe-compatible connection mechanisms.

Each edge card connector 900 also includes at least one additional connection mechanism (e.g., 911, 915, 921, 923, 931, 942) with electrical contacts that provide additional power delivery to an add-in card (e.g., PCIe add-in card 500 of FIG. 5) that has corresponding edge finger tabs configured to receive power from such mechanisms (e.g., edge finger tabs 506, 508 of FIG. 5). In some embodiments, the additional connection mechanisms may include electrical contacts that provide some signaling functionality as well (e.g., signals to a power supply that indicate the presence or removal of a card from the mechanism, to enable the power connection mechanism, etc.).

In FIG. 9A, the PCIe-compatible connection mechanism 913 is housed in an edge card connector 912 that is separate from the edge card connectors 910, 914 that house the additional connection mechanisms 911, 914, respectively, that are configured for additional power delivery and signaling. By contrast, in FIG. 9B, the PCIe-compatible connection mechanism 922 is housed in the same edge card connector 920 as the additional connection mechanisms 921, 923, that are configured for additional power delivery and signaling. Likewise, in FIGS. 9C, 9D, the PCIe-compatible connection mechanisms (932, 941) are housed in the same edge card connector (930, 940) as the additional connection mechanisms (931, 942) that are configured for additional power delivery and signaling.

In some embodiments, heights of the additional connection mechanisms (i.e., into or out of the page with reference to FIGS. 9A-9D) may be different than the PCIe-compatible connection mechanisms to account for a height difference between the additional edge finger tabs of an add-in card and the PCIe-compatible edge finger of the card. For example, as shown in FIG. 5, the edge finger tabs 504A, 504B extend further away from the circuit board portion 502 than either of edge finger tabs 506, 508. To accommodate for such a difference, the additional edge card connection mechanisms may be higher than the PCIe-compatible edge card connection mechanisms as shown in FIGS. 6-7.

Figure 10:
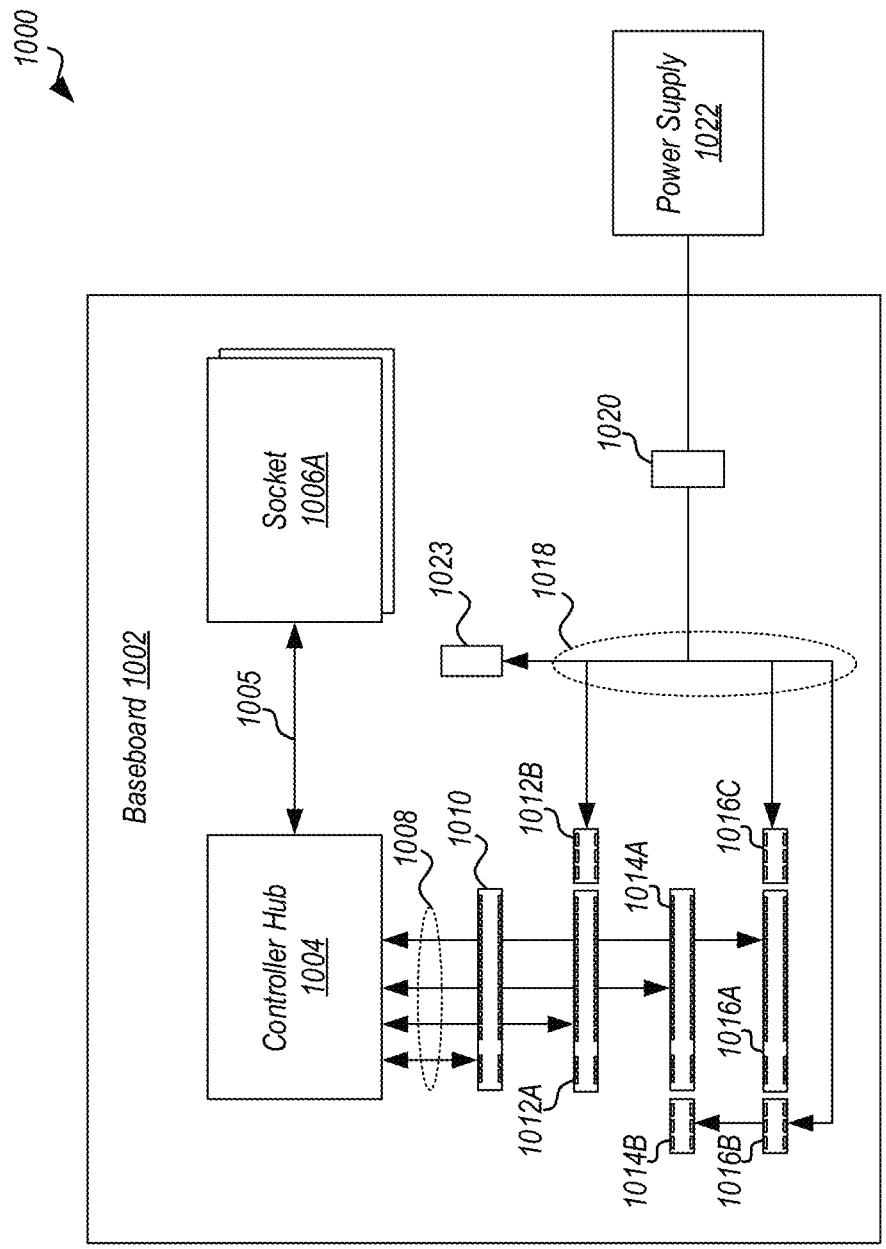
FIG. 10 illustrates an embodiment of a system that may incorporate PCIe-compatible add-in cards with additional edge connectors for providing power delivery.

FIG. 10 illustrates an embodiment of a system 1000 that may incorporate PCIe-compatible add-in cards with additional edge connectors for providing power delivery. One or more aspects of the system 1000 may be incorporated into a computing system, such as a personal computing system (e.g., a laptop, desktop, mobile, smartphone, Internet of Things (IoT) device, smart appliance, gaming console, media console, etc.), a server computing system (e.g., a rack server, blade server, tower server, rack scale server architecture or other disaggregated server architecture), or another type of computing system. In some cases, the components shown in FIG. 10 may be housed within a chassis. The system 1000 shown in FIG. 10 is a simplified diagram of an example embodiment, and the system 1000 may include fewer or additional components or features than those shown in FIG. 10.

In the example shown, the system 1000 includes a baseboard 1002 that includes a controller hub 1004, sockets 1006 to connect respective processor devices (e.g., CPUs, GPUs, or other types of processor devices) to the baseboard 1002, and multiple connection mechanisms 1010, 1012, 1014, 1016 for connecting respective peripheral devices (e.g., add-in cards) to the baseboard 1002. The controller hub 1004 communicably couples the sockets 1006 to the connection mechanisms 1010, 1012A, 1014A, 1016A using links 1005, 1008. Collectively, the controller hub 1004 and the links 1005, 1008 may be referred to as an interconnect architecture. In some embodiments, the controller hub 1004 may implement an interconnect protocol, such as a PCIe-based protocol, to facilitate communications between processors housed by the sockets and peripheral devices housed by the connection mechanisms.

The baseboard 1002 also includes a connector 1020 that includes one or more electrical contacts to couple a power supply 1022 to the baseboard 1002. The baseboard 1002 further includes power delivery traces 1018 that deliver power from the power supply 1022 to the additional connection mechanisms 1012B, 1014B, 1016B, 1016C. The baseboard 1002 may also include additional power delivery traces (not shown) that deliver power to other components of the baseboard 1002, such as to the controller hub 1004, the sockets 1006, and other connection mechanisms (e.g., 1010, 1012A, 1014A, 1016A). Collectively, the power delivery lines 1018 (and those not shown in the simplified diagram of FIG. 10), connector 1020, and power supply 1022 may be referred to as a power delivery architecture. In some embodiments, the power supply 1022 may deliver one or more of a 3.3 VDC rail voltage, a 12 VDC rail voltage, a 48 VDC rail voltage, or another DC rail voltage to the additional connection mechanisms 1012B, 1014B, 1016B, 1016C through the power delivery architecture. In other embodiments, the power supply 1022 is supplemental to another system power supply that provides a 12 VDC rail voltage and a 3.3 VDC rail voltage to the connection mechanisms 1010, 1012A, 1014A, 1016A through the power delivery architecture, and the power supply 1022 provides one of a 48 VDC rail voltage or a supplemental 12 VDC rail voltage to the additional connection mechanisms 1012B, 1014B, 1016B, 1016C through the power delivery architecture.

In some embodiments, the power supply 1022 may be mounted external to a chassis in which the baseboard 1002 resides. For instance, the chassis may include an internal power supply to supply 3.3 VDC and 12 VDC rails to components of the baseboard 1002, and the external power supply 1022 may be used to supply additional VDC rail voltages to the additional power supply mechanisms 1012B, 1014B, 1016B, 1016C. In other embodiments, the power supply 1022 is located inside a chassis in which the baseboard 1002 resides. In some embodiments, the additional power delivery traces 1018 may be routed away from the high speed signaling traces 1008 (e.g., near the outer edge of the baseboard 1002, such as near a rear end of a system chassis in which the baseboard is located) connected to the existing connection mechanisms 1010, 1012A, 1014A, 1016A, as shown in FIG. 10. In some embodiments, the connector 1020 may be located closer to an outer edge of the baseboard (e.g., on the left side of the baseboard 1002 in FIG. 10) such that the connector 1020 is closer to the connection mechanisms 1014B, 1016B, which may reduce the length of the power delivery traces 1018 on the baseboard 1002 and minimize any potential interference with the signaling traces 1008.

Each of the example connection mechanisms 1010, 1012A, 1014A, 1016A include electrical contacts that provide signaling and power delivery according to a PCIe-based specification or protocol. Thus, the connection mechanisms 1010, 1012A, 1014A, 1016A may be considered PCIe-compatible. For example, the connection mechanisms 1010, 1012A, 1014A, 1016A may be an x1, x4, x8, or x16 PCIe edge connector. The connection mechanisms 1012B, 1014B, 1016A, 1016B include electrical contacts that may provide additional power delivery to a peripheral device (e.g., PCIe add-in card 500 of FIG. 5) that has corresponding edge finger tabs configured to receive power from such mechanisms (e.g., edge finger tabs 506, 508 of FIG. 5). In the example shown, the PCIe-compatible connection mechanisms (e.g., 1010, 1012A, 1014A, 1016A) are housed in separate edge card connectors from the connection mechanisms configured for additional power delivery (e.g., 1012B, 1014B, 1016A, 1016B). However, in some embodiments, the two types of connection mechanisms may be housed in the same edge card connector (e.g., as shown in FIGS. 6-7).

Further, the example system 1000 includes an additional power connector 1023 that may be used to connect to an additional edge finger of an add-in card (e.g., edge finger tabs 506, 508 of FIG. 5) that is in one of the slots of the system 1000 that does not include an additional connection mechanism. For example, an add-in card with an additional edge finger to provide additional power delivery (e.g., edge finger tab 604 of FIG. 6 or edge finger tab 704 of FIG. 7) may be inserted into the slot associated with connection mechanism 1010. A cable may be connected to the additional edge finger and then connected to the power connector 1023 or directly to the power supply 1022 to provide the additional power delivery to the add-in card through its additional edge finger, even though the slot does not include an additional connection mechanism (like the other slots of system 1000).

Note that the apparatuses, methods, and systems described above may be implemented in any electronic device or system as aforementioned. As specific illustrations, the figures described below provide exemplary systems for utilising the present disclosure. As the systems below are described in more detail, a number of different interconnects are disclosed, described, and revisited from the discussion above. And as is readily apparent, the advances described above may be applied to any of those interconnects, fabrics, or architectures. For instance, a host and device may be implemented, which are equipped with functionality to implement the features discussed in the examples above, in any one of a variety of computing architectures (e.g., using any one of a variety of different interconnects or fabrics).

Figure 11:
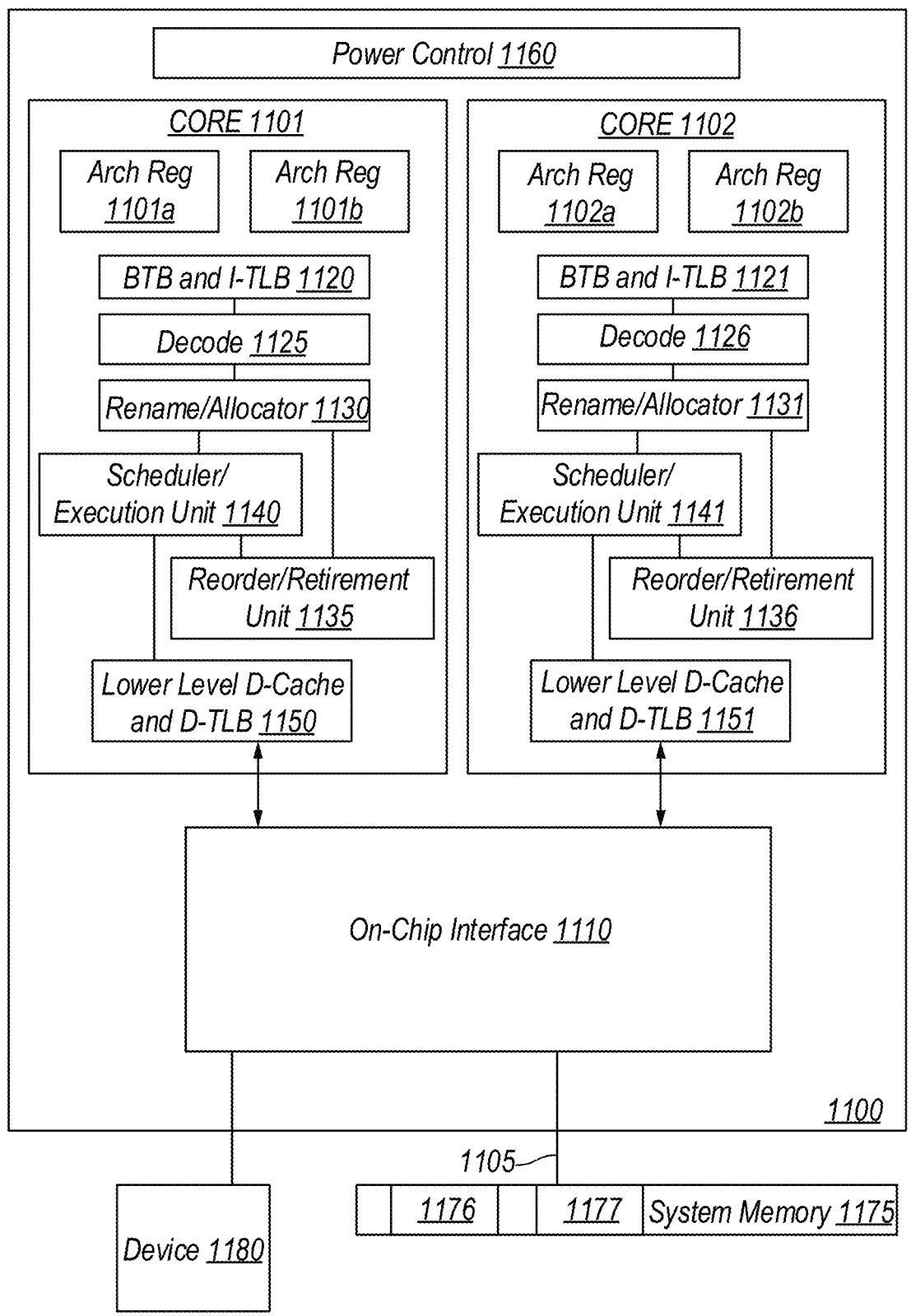
FIG. 11 illustrates an embodiment of a block diagram for a computing system including a multicore processor.

Referring to FIG. 11, an embodiment of a block diagram for a computing system including a multicore processor is depicted. Processor 1100 includes any processor or processing device, such as a microprocessor, an embedded processor, a digital signal processor (DSP), a network processor, a handheld processor, an application processor, a co-processor, a system on a chip (SOC), or other device to execute code. Processor 1100, in one embodiment, includes at least two cores—core 1101 and 1102, which may include asymmetric cores or symmetric cores (the illustrated embodiment). However, processor 1100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 1100, as illustrated in FIG. 11, includes two cores—core 1101 and 1102. Here, core 1101 and 1102 are considered symmetric cores, i.e. cores with the same configurations, functional units, and/or logic. In another embodiment, core 1101 includes an out-of-order processor core, while core 1102 includes an in-order processor core. However, cores 1101 and 1102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 1101 are described in further detail below, as the units in core 1102 operate in a similar manner in the depicted embodiment.

As depicted, core 1101 includes two hardware threads 1101a and 1101b, which may also be referred to as hardware thread slots 1101a and 1101b. Therefore, software entities, such as an operating system, in one embodiment potentially view processor 1100 as four separate processors, i.e., four logical processors or processing elements capable of executing four software threads concurrently. As alluded to above, a first thread is associated with architecture state registers 1101a, a second thread is associated with architecture state registers 1101b, a third thread may be associated with architecture state registers 1102a, and a fourth thread may be associated with architecture state registers 1102b. Here, each of the architecture state registers (1101a, 1101b, 1102a, and 1102b) may be referred to as processing elements, thread slots, or thread units, as described above. As illustrated, architecture state registers 1101a are replicated in architecture state registers 1101b, so individual architecture states/contexts are capable of being stored for logical processor 1101a and logical processor 1101b. In core 1101, other smaller resources, such as instruction pointers and renaming logic in allocator and renamer block 1130 may also be replicated for threads 1101a and 1101b. Some resources, such as re-order buffers in reorder/retirement unit 1135, ILTB 1120, load/store buffers, and queues may be shared through partitioning. Other resources, such as general purpose internal registers, page-table base register(s), low-level data-cache and data-TLB 1115, execution unit(s) 1140, and portions of out-of-order unit 1135 are potentially fully shared.

Processor 1100 often includes other resources, which may be fully shared, shared through partitioning, or dedicated by/to processing elements. In FIG. 11, an embodiment of a purely exemplary processor with illustrative logical units/resources of a processor is illustrated. Note that a processor may include, or omit, any of these functional units, as well as include any other known functional units, logic, or firmware not depicted. As illustrated, core 1101 includes a simplified, representative out-of-order (OOO) processor core. But an in-order processor may be utilized in different embodiments. The OOO core includes a branch target buffer 1120 to predict branches to be executed/taken and an instruction-translation buffer (I-TLB) 1120 to store address translation entries for instructions.

Core 1101 further includes decode module 1125 coupled to fetch unit 1120 to decode fetched elements. Fetch logic, in one embodiment, includes individual sequencers associated with thread slots 1101a, 1101b, respectively. Usually core 1101 is associated with a first ISA, which defines/specifies instructions executable on processor 1100. Often machine code instructions that are part of the first ISA include a portion of the instruction (referred to as an opcode), which references/specifies an instruction or operation to be performed. Decode logic 1125 includes circuitry that recognizes these instructions from their opcodes and passes the decoded instructions on in the pipeline for processing as defined by the first ISA. For example, as discussed in more detail below decoders 1125, in one embodiment, include logic designed or adapted to recognize specific instructions, such as transactional instruction. As a result of the recognition by decoders 1125, the architecture or core 1101 takes specific, predefined actions to perform tasks associated with the appropriate instruction. It is important to note that any of the tasks, blocks, operations, and methods described herein may be performed in response to a single or multiple instructions; some of which may be new sor old instructions. Note decoders 1126, in one embodiment, recognize the same ISA (or a subset thereof). Alternatively, in a heterogeneous core environment, decoders 1126 recognize a second ISA (either a subset of the first ISA or a distinct ISA).

In one example, allocator and renamer block 1130 includes an allocator to reserve resources, such as register files to store instruction processing results. However, threads 1101a and 1101b are potentially capable of out-of-order execution, where allocator and renamer block 1130 also reserves other resources, such as reorder buffers to track instruction results. Unit 1130 may also include a register renamer to rename program/instruction reference registers to other registers internal to processor 1100. Reorder/retirement unit 1135 includes components, such as the reorder buffers mentioned above, load buffers, and store buffers, to support out-of-order execution and later in-order retirement of instructions executed out-of-order.

Scheduler and execution unit(s) block 1140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1150 are coupled to execution unit(s) 1140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1101 and 1102 share access to higher-level or further-out cache, such as a second level cache associated with on-chip interface 1110. Note that higher-level or further-out refers to cache levels increasing or getting further way from the execution unit(s). In one embodiment, higher-level cache is a last-level data cache—last cache in the memory hierarchy on processor 1100—such as a second or third level data cache. However, higher level cache is not so limited, as it may be associated with or include an instruction cache. A trace cache—a type of instruction cache—instead may be coupled after decoder 1125 to store recently decoded traces. Here, an instruction potentially refers to a macro-instruction (i.e. a general instruction recognized by the decoders), which may decode into a number of micro-instructions (micro-operations).

In the depicted configuration, processor 1100 also includes on-chip interface module 1110. Historically, a memory controller, which is described in more detail below, has been included in a computing system external to processor 1100. In this scenario, on-chip interface 1110 is to communicate with devices external to processor 1100, such as system memory 1175, a chipset (often including a memory controller hub to connect to memory 1175 and an I/O controller hub to connect peripheral devices), a memory controller hub, a northbridge, or other integrated circuit. And in this scenario, bus 1105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 1175 may be dedicated to processor 1100 or shared with other devices in a system. Common examples of types of memory 1175 include DRAM, SRAM, non-volatile memory (NV memory), and other known storage devices. Note that device 1180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1100. For example in one embodiment, a memory controller hub is on the same package and/or die with processor 1100. Here, a portion of the core (an on-core portion) 1110 includes one or more controller(s) for interfacing with other devices such as memory 1175 or a graphics device 1180. The configuration including an interconnect and controllers for interfacing with such devices is often referred to as an on-core (or un-core configuration). As an example, on-chip interface 1110 includes a ring interconnect for on-chip communication and a high-speed serial point-to-point link 1105 for off-chip communication. Yet, in the SOC environment, even more devices, such as the network interface, co-processors, memory 1175, graphics processor 1180, and any other known computer devices/interface may be integrated on a single die or integrated circuit to provide small form factor with high functionality and low power consumption.

In one embodiment, processor 1100 is capable of executing a compiler, optimization, and/or translator code 1177 to compile, translate, and/or optimize application code 1176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 12:
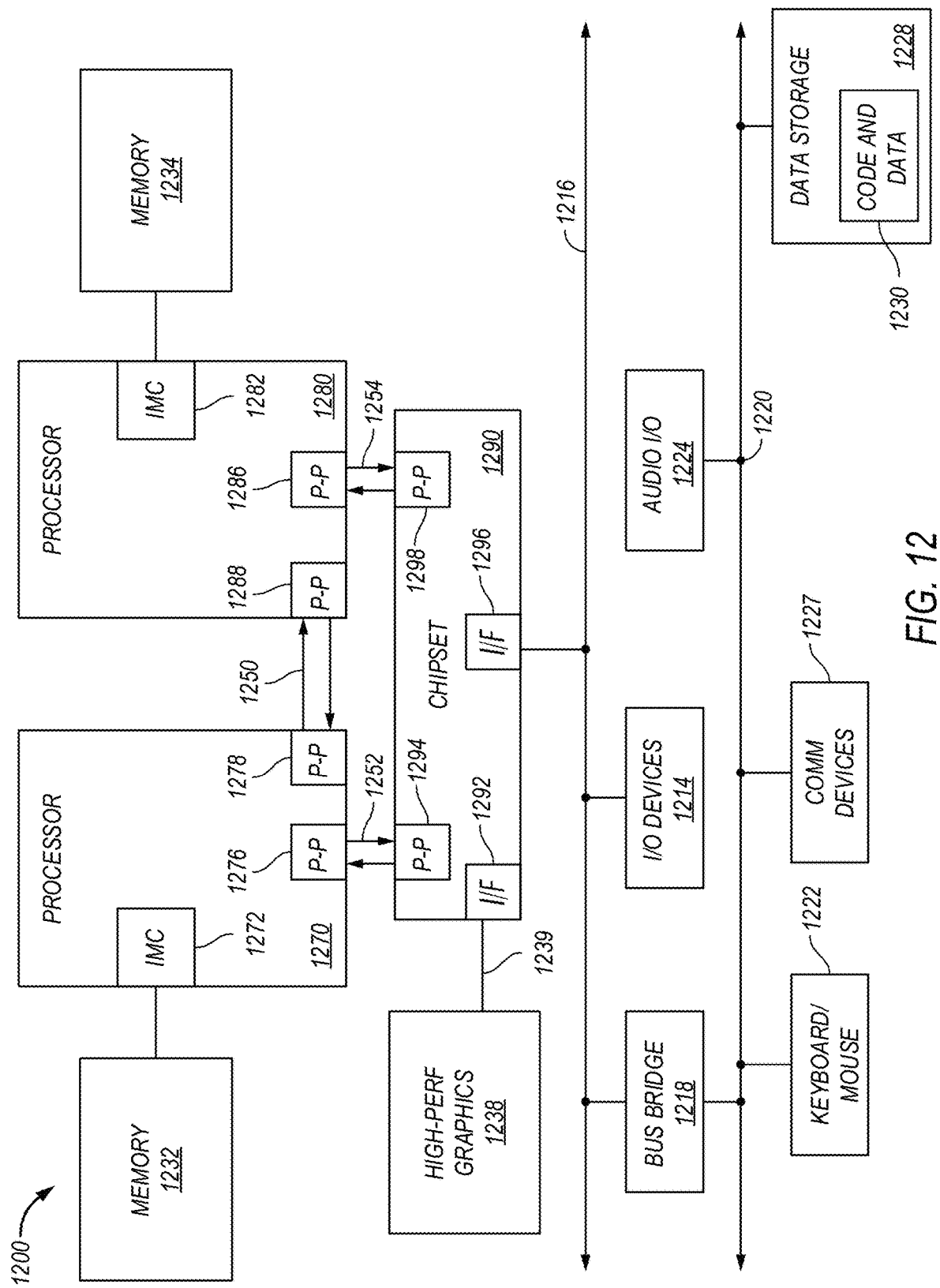
FIG. 12 illustrates an embodiment of a block for a computing system including multiple processors.

Referring now to FIG. 12, shown is a block diagram of another system 1200 in accordance with an embodiment of the present disclosure. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of a processor. In one embodiment, 1252 and 1254 are part of a serial, point-to-point coherent interconnect fabric, such as a high-performance architecture. As a result, certain embodiments may be implemented within the QPI architecture.

While shown with only two processors 1270, 1280, it is to be understood that the scope of the present disclosure is not so limited. In other embodiments, one or more additional processors may be present in a given processor.

Processors 1270 and 1280 are shown including integrated memory controller units 1272 and 1282, respectively. Processor 1270 also includes as part of its bus controller units point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 each exchange information with a chipset 1290 via individual P-P interfaces 1252, 1254 using point to point interface circuits 1276, 1294, 1286, 1298. Chipset 1290 also exchanges information with a high-performance graphics circuit 1238 via an interface circuit 1292 along a high-performance graphics interconnect 1239.

A shared cache (not shown) may be included in either processor or outside of both processors; yet connected with the processors via P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present disclosure is not so limited.

As shown in FIG. 12, various I/O devices 1214 are coupled to first bus 1216, along with a bus bridge 1218 which couples first bus 1216 to a second bus 1220. In one embodiment, second bus 1220 includes a low pin count (LPC) bus. Various devices are coupled to second bus 1220 including, for example, a keyboard and/or mouse 1222, communication devices 1227 and a storage unit 1228 such as a disk drive or other mass storage device which often includes instructions/code and data 1230, in one embodiment. Further, an audio I/O 1224 is shown coupled to second bus 1220. Note that other architectures are possible, where the included components and interconnect architectures vary. For example, instead of the point-to-point architecture of FIG. 12, a system may implement a multi-drop bus or other such architecture.

The foregoing disclosure has presented a number of example mechanisms for delivering power to PCIe add-in cards through additional edge finger tabs. It should be appreciated that other mechanisms may be provided in addition to those identified above without departing from the more generalized principles contained within this disclosure. For instance, while some of the example power delivery mechanisms discussed herein were described with reference to PCIe or PCIe-based protocols, it should be appreciated that similar, corresponding enhancements may be made to other interconnect protocols, such OpenCAPI™, Gen-Z™, UPI, Universal Serial Bus, (USB), Cache Coherent Interconnect for Accelerators (CCIX™), Advanced Micro Device™'s (AMD™) Infinity™ Common Communication Interface (CCI), or Qualcomm™'s Centrig™ interconnect, among others.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform certain embodiments may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

The following examples pertain to embodiments in accordance with this Specification.

Example 1 includes a device that includes: a circuit board comprising a plurality of circuit components; a first edge finger tab extending from the circuit board, wherein the first edge finger tab comprises a plurality of electrical contacts to provide signaling to and from particular circuit components of the circuit board, and the first edge finger tab is to mate with a Peripheral Component Interconnect Express (PCIe)-compatible edge card connection mechanism of a baseboard; and a second edge finger tab extending from the circuit board, wherein the second edge finger tab comprises one or more electrical contacts to provide power delivery to the circuit board, and the second edge finger tab is to mate with a second edge card connection mechanism of the baseboard.

Example 2 includes the subject matter of Example 1, and optionally, wherein the second edge finger tab is between the first edge finger tab and an end of the device that is to face an outer edge of the baseboard when the device is mated with the baseboard.

Example 3 includes the subject matter of Examples 1 or 2, and optionally, wherein the second edge finger tab is to prevent the device from being inserted into a legacy PCI edge card connection mechanism.

Example 4 includes the subject matter of Example 1, and optionally, wherein the second edge finger tab is between the first edge finger tab and an end of the device that is to face inward relative to a baseboard when the device is mated with the baseboard.

Example 5 includes the subject matter of Examples 1 or 4, and optionally, wherein the second edge finger tab is to engage with a retention mechanism of a baseboard when the device is mated with the baseboard.

Example 6 includes the subject matter of any one of Examples 1-5, and optionally, wherein the second edge finger tab comprises one or more electrical contacts to provide signaling to or from one or more of the circuit components of the circuit board portion.

Example 7 includes the subject matter of any one of Examples 1-6, and optionally, wherein an outer end of the second edge finger tab is chamfered.

Example 8 includes the subject matter of any one of Examples 1-7, and optionally, further comprising a third edge finger tab extending from the circuit board, wherein the third edge finger tab comprises one or more electrical contacts to provide power delivery to the circuit board and is adapted to mate with a third baseboard connection mechanism.

Example 9 includes the subject matter of any one of Examples 1-8, and optionally, wherein the electrical contacts of the second edge finger tab are to alternatively provide one of a 12 VDC rail voltage or a 48 VDC rail voltage to circuit components of the circuit board.

Example 10 includes a baseboard that includes: one or more electrical contacts to receive power from a power supply; one or more sockets to each house a processor; an interconnect architecture for connecting the one or more sockets to at least one peripheral devices according to a Peripheral Component Interconnect Express (PCIe)-based interconnect protocol; a first edge card connection mechanism comprising electrical contacts to couple a particular peripheral device to the interconnect architecture when a PCIe-compatible edge finger tab region of the particular peripheral device is mated with the first edge card connection mechanism; and a second edge card connection mechanism in-line with the first edge card mechanism, the second edge card connection mechanism comprising electrical contacts to provide power delivery from the power supply to the particular peripheral device when a second edge finger tab of the particular peripheral device is mated with the second edge card connection mechanism.

Example 11 includes the subject matter of Example 10, and optionally, wherein the second edge card connection mechanism is between the first edge card connection mechanism and an outer edge of the baseboard.

Example 12 includes the subject matter of Example 10, and optionally, wherein the first edge card connection mechanism is between the second edge card connection mechanism and an outer edge of the baseboard.

Example 13 includes the subject matter of Examples 10, 11, or 12, and optionally, wherein the first and second edge card connection mechanisms are housed in the same edge card connector on the baseboard.

Example 14 includes the subject matter of Examples 10, 11, or 12, and optionally, wherein the first edge card connection mechanism is housed in a first edge card connector of the baseboard, and the second edge card connection mechanism is housed in a second edge card connector of the baseboard.

Example 15 includes the subject matter of any one of Examples 10-14, and optionally, wherein the second edge card connection mechanism comprises electrical contacts to provide signaling to or from the particular peripheral device in addition to power delivery.

Example 16 includes the subject matter of any one of Examples 10-15, and optionally, further comprising a third edge card connection in-line with the first and second edge card connection mechanisms, the third edge card connection mechanism comprising electrical contacts to provide power delivery from the power supply to the particular peripheral device when a third edge finger tab of the particular peripheral device is mated with the third edge card connection mechanism.

Example 17 includes a system that includes: a processor; an add-in card device; a power supply; an interconnect architecture for connecting the processor to the add-in card device according to a Peripheral Component Interconnect Express (PCIe)-based interconnect protocol; and a power delivery architecture for delivering power from the power supply to components of the system; wherein the add-in card device comprises: a PCIe-compatible edge finger tab region comprising edge finger tabs coupling circuit components of the add-in card device to the interconnect architecture through a first edge card connection mechanism; and a second edge finger tab in-line with the tabs of the PCIe-compatible edge finger tab region, the second edge finger tab coupling circuit components of the add-in card device to the power delivery architecture through a second edge card connection mechanism.

Example 18 includes the subject matter of Example 17, and optionally, wherein the add-in card device further comprises a third edge finger tab in-line with the tabs of the PCIe-compatible edge finger tab region, the third edge finger tab to couple circuit components of the add-in card device to the power delivery architecture through a third edge card connection mechanism.

Example 19 includes the subject matter of Example 17, and optionally, wherein the first edge card connection mechanism is housed in a first edge card connector of a baseboard, and the second edge card connection mechanism includes a cable coupling the additional edge finger tab to the power supply.

Example 20 includes the subject matter of any one of Examples 17-19, and optionally, wherein the power supply alternatively provides one of a 12 VDC rail voltage or a 48 VDC rail voltage, and the power delivery architecture is to deliver the rail voltage provided by the power supply to the additional edge finger tab of the add-in card.

Example 21 includes the subject matter of any one of Examples 17-20, and optionally, wherein the power supply is external to a chassis in which the add-in card is located.

Example 22 includes the subject matter of any one of Examples 17-21, and optionally, wherein the power supply is a first power supply, the system further includes a second power supply that provides a 12 VDC rail voltage and a 3.3 VDC rail voltage, and the power delivery architecture delivers power from the second power supply to the add-in card through the first edge card connection mechanism.

Example 23 includes the subject matter of any one of Examples 1-9, and optionally, wherein the device is incorporated into a server architecture, such as a blade server or rack mounted server.

Example 24 includes the subject matter of any one of Examples 10-16, and optionally, wherein the baseboard is incorporated into a server architecture, such as a blade server or rack mounted server.

Example 25 includes the subject matter of Example 17, and optionally, wherein the add-in card device is configured according to any one of the Examples 1-9.

Example 26 includes the subject matter of Example 17, and optionally, wherein the system further includes a baseboard configured according to any one of the Examples 10-16, wherein the add-in card is coupled to the baseboard.

Example 27 includes the subject matter of any one of Examples 1-8, and optionally, wherein the second edge finger tab includes a PCIe-compatible feature that is typically to prevent the device from being inserted into a legacy PCI edge card connection mechanism.

Example 28 includes the subject matter of any one of Examples 1-8, and optionally, wherein the second edge finger tab includes a PCIe-compatible feature that is typically to engage a retention mechanism of a baseboard.

Example 29 includes the subject matter of Example 17, and optionally, wherein the second edge finger tab is compatible with a PCIe-compatible feature that is typically to prevent the device from being inserted into a legacy PCI edge card connection mechanism.

Example 30 includes the subject matter of Example 17, and optionally, wherein the second edge finger tab is compatible with a PCIe-compatible feature that is typically to engage a retention mechanism of a baseboard.

Example 31 includes the subject matter of Examples 1, 2, or 3, and optionally, wherein the second edge finger tab is generally rectangular shaped.

Example 32 includes the subject matter of Examples 1, 4, or 5, and optionally, wherein the second edge finger tab is generally hockey stick shaped.

Example 33 includes the subject matter of Example 8, and optionally, further comprising a first current blocking element coupled to the second edge finger tab and a second current blocking element coupled to the third edge finger tab; wherein the first and second current blocking elements are to selectively accept power from either the second edge finger tab or the third edge finger tab.

Example 34 includes the subject matter of Example 18, and optionally, wherein the add-in card further comprises a first current blocking element coupled to the additional edge finger tab and a second current blocking element coupled to the third edge finger tab; wherein the first and second current blocking elements are to selectively accept power from either the additional edge finger tab or the third edge finger tab.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A device comprising:
    a circuit board comprising a plurality of circuit components;
    a first edge finger tab extending from the circuit board, wherein the first edge finger tab comprises a plurality of electrical contacts to provide signaling to and from particular circuit components of the circuit board, and the first edge finger tab is to mate with a Peripheral Component Interconnect Express (PCIe)-compatible edge card connection mechanism of a baseboard; and
    a second edge finger tab extending from the circuit board, wherein the second edge finger tab comprises one or more electrical contacts to provide power delivery to the circuit board, and the second edge finger tab is to mate with a second edge card connection mechanism of the baseboard.

2. The device of claim 1, wherein the second edge finger tab is between the first edge finger tab and an end of the device that is to face an outer edge of the baseboard when the device is mated with the baseboard.

3. The device of claim 1, wherein the second edge finger tab is to prevent the device from being inserted into a legacy PCI edge card connection mechanism.

4. The device of claim 1, wherein the second edge finger tab is between the first edge finger tab and an end of the device that is to face inward relative to a baseboard when the device is mated with the baseboard.

5. The device of claim 1, wherein the second edge finger tab is to engage with a retention mechanism of a baseboard when the device is mated with the baseboard.

6. The device of claim 1, wherein the second edge finger tab comprises one or more electrical contacts to provide signaling to or from one or more of the circuit components of the circuit board portion.

7. The device of claim 1, further comprising a third edge finger tab extending from the circuit board, wherein the third edge finger tab comprises one or more electrical contacts to provide power delivery to the circuit board and is adapted to mate with a third baseboard connection mechanism.

8. The device of claim 1, further comprising:
    a first current blocking element coupled to the second edge finger tab; and
    a second current blocking element coupled to the third edge finger tab;
    wherein the first and second current blocking elements are to selectively accept power from either the second edge finger tab or the third edge finger tab.

9. The device of claim 1, wherein the electrical contacts of the second edge finger tab are to alternatively provide one of a 12 VDC rail voltage or a 48 VDC rail voltage to circuit components of the circuit board.

10. A baseboard, comprising:
    one or more electrical contacts to receive power from a power supply;
    one or more sockets to each house a processor;
    an interconnect architecture for connecting the one or more sockets to at least one peripheral device according to a Peripheral Component Interconnect Express (PCIe)-based interconnect protocol;
    a first edge card connection mechanism comprising electrical contacts to couple a particular peripheral device to the interconnect architecture when a PCIe-compatible edge finger tab region of the particular peripheral device is mated with the first edge card connection mechanism; and
    a second edge card connection mechanism in-line with the first edge card mechanism, the second edge card connection mechanism comprising electrical contacts to provide power delivery from the power supply to the particular peripheral device when an additional edge finger tab of the particular peripheral device is mated with the second edge card connection mechanism.

11. The baseboard of claim 10, wherein the second edge card connection mechanism is between the first edge card connection mechanism and an outer edge of the baseboard.

12. The baseboard of claim 10, wherein the first edge card connection mechanism is between the second edge card connection mechanism and an outer edge of the baseboard.

13. The baseboard of claim 10, wherein the first and second edge card connection mechanisms are housed in the same edge card connector on the baseboard.

14. The baseboard of claim 10, wherein the first edge card connection mechanism is housed in a first edge card connector of the baseboard, and the second edge card connection mechanism is housed in a second edge card connector of the baseboard.

15. The baseboard of claim 10, wherein the second edge card connection mechanism comprises electrical contacts to provide signaling to or from the particular peripheral device in addition to power delivery.

16. The baseboard of claim 10, further comprising a third edge card connection in-line with the first and second edge card connection mechanisms, the third edge card connection mechanism comprising electrical contacts to provide power delivery from the power supply to the particular peripheral device when a third edge finger tab of the particular peripheral device is mated with the third edge card connection mechanism.

17. A system, comprising:
a processor;
an add-in card device;
a power supply;
an interconnect architecture for connecting the processor to the add-in card device according to a Peripheral Component Interconnect Express (PCIe)-based interconnect protocol; and
a power delivery architecture for delivering power from the power supply to components of the system;
wherein the add-in card device comprises:
a PCIe-compatible edge finger tab region comprising edge finger tabs coupling circuit components of the add-in card device to the interconnect architecture through a first edge card connection mechanism; and
an additional edge finger tab in-line with the tabs of the PCIe-compatible edge finger tab region, the additional edge finger tab coupling circuit components of the add-in card device to the power delivery architecture through a second edge card connection mechanism.

18. The system of claim 17, wherein the add-in card device further comprises a third edge finger tab in-line with the tabs of the PCIe-compatible edge finger tab region, the third edge finger tab to couple circuit components of the add-in card device to the power delivery architecture through a third edge card connection mechanism.

19. The system of claim 17, wherein the first edge card connection mechanism is housed in a first edge card connector of a baseboard, and the second edge card connection mechanism includes a cable coupling the additional edge finger tab to the power supply.

20. The system of claim 17, wherein the power supply alternatively provides one of a 12 VDC rail voltage or a 48 VDC rail voltage, and the power delivery architecture is to deliver the rail voltage provided by the power supply to the additional edge finger tab of the add-in card.

* * * * *